(12) United States Patent
Shimada

(10) Patent No.: US 7,310,006 B2
(45) Date of Patent: Dec. 18, 2007

(54) SEMICONDUCTOR INTEGRATED CIRCUIT

(75) Inventor: Eiji Shimada, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 63 days.

(21) Appl. No.: 11/274,184

(22) Filed: Nov. 16, 2005

(65) Prior Publication Data

US 2006/0103428 A1 May 18, 2006

(30) Foreign Application Priority Data

Nov. 17, 2004 (JP) .............................. 2004-333177

(51) Int. Cl.
*H03K 19/094* (2006.01)
*H03K 19/0175* (2006.01)
*H03K 5/08* (2006.01)

(52) U.S. Cl. .................... 326/83; 327/110; 327/309

(58) Field of Classification Search ................. 326/17, 326/82, 83; 327/108, 110, 309, 314
See application file for complete search history.

(56) References Cited

U.S. PATENT DOCUMENTS 6,087,877 A * 7/2000 Gonda et al. ............... 327/309
7,129,759 B2 * 10/2006 Fukami ...................... 327/110

FOREIGN PATENT DOCUMENTS

JP 2002-151989 5/2002
JP 2005-223399 8/2005

* cited by examiner

*Primary Examiner*—Daniel Chang
(74) *Attorney, Agent, or Firm*—McGinn IP Law Group, PLLC

(57) ABSTRACT

To provide an output MOS transistor from breaking due to dump surge and counter electromotive, a semiconductor integrated circuit according to an embodiment of the invention includes an output MOS transistor controlling current flowing through a load, a dynamic clamp circuit clamping an overvoltage applied to the output MOS transistor, a delay circuit generating a reference signal by adjusting a level of a gate voltage of the output MOS transistor, and a clamp controlling circuit making the dynamic clamp circuit operate based on the reference signal when a counter electromotive force is applied to the output MOS transistor.

15 Claims, 13 Drawing Sheets

SEMICONDUCTOR INTEGRATED CIRCUIT

BACKGROUND OF THE INVENTION

1. Field of the Invention

The present invention relates to a semiconductor integrated circuit, in particular, a semiconductor integrated circuit having a protective circuit for protecting an output transistor against overvoltage.

2. Description of Related Art

For automobiles and home electrical products, a power IC (integrated circuit, also called "power semiconductor") having a switching element for controlling a voltage or current has been used. In response thereto, various techniques for protecting this switching element from overvoltage have been proposed (see Japanese Unexamined Patent Publication No. 2002-151989, for example). To give an example of the overvoltage, there are a counter electromotive force applied from the inductive load side and a dump surge applied from the power supply side.

FIG. 10 is a circuit diagram showing the configuration of a conventional power IC 91. The conventional power IC 91 includes an output MOS transistor M0 that is a metal oxide semiconductor field effect transistor (MOSFET, hereinafter also referred to as "MOS" or "MOS transistor") as a switching element for controlling current. In the illustrated example, the output MOS transistor M0 is connected with the power supply ahead of a load (inductive load 3), and so functions as a high-side switch. The inductive load 3 is, for example, an actuator, which is an equivalent circuit composed of an inductance component and a resistance component.

In this embodiment, the terms "off", "on", "turn-off", and "turn-on" mean, if used singly, "off", "on", "turn-off", and "turn-on" of the output MOS transistor, respectively. The transition of the MOS transistor from an on state to a completely off state is called "turn-off", and the transition of the MOS transistor from an off state to a completely on state is called "turn-on".

The output MOS transistor M0 has a drain supplied with power through a terminal Vbb (power supply terminal), has a gate whose voltage is boosted by a charge pump circuit 12 through a resistor R3, and has a source connected with the inductive load 3 through an terminal OUT (output terminal). A gate discharge MOS transistor N1 for discharging the gate of the output MOS transistor M0 has a drain connected with a node between the charge pump circuit 12 and the resistor R3, has a gate receiving a control signal S2, and has a source connected with the terminal OUT.

The charge pump circuit 12 is turned on/off in response to a control signal S1 supplied from a microprocessor or the like, and the gate discharge MOS transistor N1 is turned on/off in response to the control signal S2 supplied from the microprocessor or the like.

Further, the conventional power IC 91 includes a dynamic clamp circuit 31 for protecting the output MOS transistor M0 from breakdown due to the counter electromotive force, which is provided between the drain and gate of the output MOS transistor M0. The dynamic clamp circuit 31 includes a high-voltage diode D6 and a backflow preventive diode D7.

The counter electromotive force Vinv at the turn-off results from the emission of energy $((\frac{1}{2}) \cdot L \cdot IOUT \cdot IOUT)$ accumulated in the inductance component of the inductive load 3. During the turn-off, according as a gate-source voltage Vgs of the output MOS transistor drops, an output voltage VOUT decreases to generate the counter electromotive force Vinv. At this time, if the output voltage VOUT falls down to the breakdown voltage of the high-voltage diode D6, the counter electromotive force Vinv is clamped to prevent the voltage application to the output MOS transistor M0 from going beyond the withstand voltage thereof.

On the other hand, in the conventional power IC 91, if a battery as the power supply is connected with an alternator, and a battery terminal connected with the battery falls off during the power generation of the alternator, positive overvoltage called "dump surge" (about 60 V) is applied to the terminal Vbb.

When the dump surge is applied under the off-state of the output MOS transistor M0, and clamping function of the dynamic clamp circuit 31 is activated, the output MOS transistor M0 is broken due to overheat of its own. Thus, it is necessary to set the breakdown voltage of the high-voltage diode D6 to a value not less than 60 V of the dump surge. Further, the withstand voltage of the output MOS transistor M0 should be set to a value not less than the breakdown voltage of the high-voltage diode D6. In order to keep the same on-resistance of the output MOS transistor M0, a chip area has to be enlarged in proportion to the withstand voltage of the output MOS transistor M0. A power IC having the dynamic clamp circuit 31 needs a larger chip area than a power IC without the dynamic clamp circuit 31. As a result, A power IC having the dynamic clamp circuit 31 is more expensive.

In view of such problems, the applicants of the present invention propose a semiconductor integrated circuit where a clamp controlling circuit for controlling a clamp circuit operation is provided to minimize a chip area in Japanese Unexamined Patent Publication No. 2005-223399 (corresponding U.S. patent application Ser. No. 11/035,060).

FIG. 11 is a circuit diagram showing the configuration of a conventional power IC 92 as disclosed in Japanese Unexamined Patent Publication No. 2005-223399. This conventional power IC includes a clamp controlling circuit 32 in addition to the configuration of FIG. 10. The clamp controlling circuit 32 includes a MOS transistor N2, a clamp switch MOS transistor P5, and a resistor R4.

The MOS transistor N2 has a drain connected with a terminal Vbb through the resistor R4, has a gate connected with a gate of an output MOS transistor M0, and has a source connected with a terminal OUT. The clamp switch MOS transistor P5 has a source connected with the terminal Vbb, has a gate connected with a node between the resistor R4 and the drain of the MOS transistor N2, and has a drain connected with the dynamic clamp circuit 31.

FIG. 12 is a waveform diagram of each signal when the output MOS transistor M0 is switched from on to off and then from off to on, in the conventional power IC 92.

To switch the output MOS transistor M0 from on to off, the control signal S1 is set LOW (low level) to stop the application of boosted voltage from the charge pump circuit 12. Further, the control signal S2 is set HIGH (high level) to turn on the gate discharge MOS transistor N1 and let gate charges of the output MOS transistor M0 flow into the terminal OUT through the resistor R3 and the gate discharge MOS transistor N1. As a result, the gate-source voltage Vgs decreases to turn off the output MOS transistor M0. Accordingly, the output current IOUT stops flowing and the output voltage VOUT comes to zero.

During a turn-off period of the output MOS transistor M0, the MOS transistor N2 is turned on due to the potential of the gate-source voltage Vgs. A voltage VR across the resistor R4 increases to turn on the clamp switch MOS transistor P5 and let the dynamic clamp circuit 31 operate. Then, the counter electromotive force Vinv that is generated with the inductive load 3 at this time is clamped with the dynamic clamp circuit 31. In this way, the conventional power IC 92 activates the dynamic clamp circuit 31 during the turn-off period.

According to the power IC 92, the withstand voltage of the output MOS transistor M0 can be therefore set without considering the breakdown voltage of the high-voltage diode D6, making it possible to reduce the withstand voltage of the output MOS transistor M0 and minimize the chip area.

However, the conventional power IC 92 of FIG. 11 has a problem that if the chip area is minimized as above, when the dump surge occurs under the off-state of the output MOS transistor M0, the output MOS transistor M0 would break.

This problem is caused due to the fact that when the dump surge occurs to abruptly increase the drain-source voltage of the output MOS transistor M0, a drain-gate or drain-source parasitic capacitance of the output MOS transistor M0 generates the voltage between the gate and source of the output MOS transistor M0.

FIG. 13 shows an equivalent circuit under the off state of the output MOS transistor in the conventional power IC 92 of FIG. 11, from which the clamp controlling circuit 32 is removed. Denoted by RN1 is an on resistance of the gate discharge MOS transistor N1. Denoted by Cdg and Cgd are a drain-gate capacitance (parasitic capacitance) and a gate-source capacitance (parasitic capacitance) of the output MOS transistor MO.

For ease of explanation, an equivalent circuit where an impedance of the inductive load 3 is set to 0 is shown in FIG. 14. Referring to the equivalent circuit of FIG. 14, a transient response (step response) of the gate-source voltage Vgs upon the occurrence of the dump surge is represented by following expressions.

$$Cdg \frac{dVdg}{dt} = Cgs \frac{dVgs}{dt} + \frac{Vgs}{R} \quad \text{(Expression 1)}$$

$$Vbb = Vdg + Vgs = \begin{cases} V_0 (t < 0) \\ V_1 (t > 0) \end{cases} \quad \text{(Expression 2)}$$

$$Cdg \times s \times Vdg(s) = Cgs \times s \times Vgs(s) + \frac{1}{R} Vgs(s) \quad \text{(Expression 3)}$$

$$Vdg(s) + Vgs(s) = V_1 - V_0 \quad \text{(Expression 4)}$$

$$Vgs(s) = (V_1 - V_0) \frac{Cdg}{Cdg + Cgs} \times \frac{1}{s + \frac{1}{(Cdg + Cgs)R}} \quad \text{(Expression 5)}$$

$$Vgs(t) = (V_1 - V_0) \frac{Cdg}{Cdg + Cgs} \times \exp\left(-\frac{1}{(Cdg + Cgs)R} t\right) \quad \text{(Expression 6)}$$

That is, an amount of current flowing through the parasitic capacitance Cdg is the sum of current flowing through the resistor R3 and current flowing through the parasitic capacitance Cgs, so Expression 1 is established. In Expression 1, Vdg represents a drain-gate voltage of the output MOS transistor MO, and R represents the sum of resistance of the resistor R3 and the on resistance RN1 of the gate discharge MOS transistor N1. Expression 2 represents the dump surge based on a unit step input. In Expression 2, Vbb represents a voltage at the terminal Vbb, V0 represents a general voltage, V1 represents a dump surge voltage, and t represents the time. The Laplace transform of Expressions 1 and 2 gives Expressions 3 and 4, respectively.

Further, omitting the drain-gate voltage Vdg (s) from Expressions 3 and 4 gives Expression 5. The inverse Laplace transform of Expression 5 gives Expression 6, which represents the transient response of the gate-source voltage Vgs.

As apparent from Expression 6, just after the occurrence of the dump surge (t=0), Vgs=(V1−V0)·Cdg/(Cdg+Cgs). If the gate-source voltage Vgs reaches or exceeds a threshold Vt2 of the MOS transistor N2 in the clamp controlling circuit 32, the MOS transistor N2 is turned on, and the clamp controlling circuit 32 makes the dynamic clamp circuit 31 operate.

For example, provided that Cdg=Cgs/10, V1=60V, and V0=12V, Vgs=4.4 V. The threshold of the output MOS transistor MO is defined as Vt0. Unless Vt2<Vt0, the clamping is impossible during the turn-off period, so Vt2 should be lower than Vt0. In general, Vt0 is about 1 to 3 V. Therefore, just after the dump surge, the gate-source voltage Vgs reaches or exceeds the threshold Vt2 of the MOS transistor N2 in the clamp controlling circuit 32. Therefore, in the conventional power IC 92, the dynamic clamp circuit 31 operates like the conventional power IC 91 of FIG. 10 if activated upon the dump surge.

FIG. 15 is a timing chart showing that the dump surge takes place in the conventional power IC 92 and the dynamic clamp circuit 31 operate. The potential at the terminal Vbb is, for example, 12V of the power supply voltage but would reach about 60V upon the dump surge and remain at the voltage level for 0.2 to 0.4 seconds. At this time, the gate-source voltage Vgs also increases, and if the voltage reaches or exceeds the threshold Vt2, the dynamic clamp circuit 31 starts operating. In addition, if the voltage at the terminal Vbb exceeds the breakdown voltage of the high-voltage diode D6, the clamping function is exerted to temporarily turn on the output MOS transistor M0. As a result, the output current IOUT starts flowing. Accordingly, in the conventional power IC 92, if the withstand voltage of the output MOS transistor M0 is set without considering the breakdown voltage of the high-voltage diode D6, the output MOS transistor MO breaks.

SUMMARY OF THE INVENTION

According to an aspect of the present invention, a semiconductor integrated circuit connected between a power supply and an inductive load includes: an output transistor controlling current flowing through the inductive load; a clamp circuit clamping an overvoltage applied to the output transistor; a reference signal generator circuit generating a reference signal by adjusting a level of a control signal input to a control electrode of the output transistor; and a clamp controlling circuit bringing the clamp circuit into operation based on the reference signal on condition that a counter electromotive force of the inductive load is applied to the output transistor. According to the semiconductor integrated circuit of the invention, even if dump surge takes place under an off state of the output transistor, the clamp controlling circuit does not operate to inactivate the clamp circuit. In addition, during the turn-off period of the output transistor, the clamp controlling circuit exerts its function to let the clamp circuit operate and clamp the counter electromotive force. Thus, it is possible to prevent breakdown of the output MOS transistor due to the dump surge and counter electromotive force with accuracy. Further, the withstand voltage of the output MOS transistor can be reduced to minimize a chip area, costs, and an installation area.

According to another aspect of the present invention, a semiconductor integrated circuit includes: a high-side switching circuit driving an inductive load; a control signal generator circuit generating a control signal controlling a driving operation of the high-side switching circuit; a discharging circuit discharging the control signal to the inductive load under an off-state of the high-side switching circuit; and a counter electromotive force protective circuit protecting the high-side switching circuit from a counter electromotive force based on a reference signal obtained by decreasing slope of a rising edge or a falling edge of the control signal. According to the semiconductor integrated circuit of the invention, even if dump surge takes place under an off state of the high-side switching circuit, the counter electromotive force protective circuit does not operate. In addition, during the turn-off period of the high-side switching circuit, the counter electromotive force protective circuit operates. Thus, it is possible to prevent breakdown of the high-side switching circuit due to the dump surge and counter electromotive force with accuracy. Further, the withstand voltage of the high-side switching circuit can be reduced to minimize a chip area, costs, and an installation area.

According to still another aspect of the present invention, a semiconductor integrated circuit includes: an output transistor connected between a power supply terminal supplied with power and an output terminal connected with an inductive load and operating in response to a control signal applied to a control terminal thereof; a clamp circuit connected between the control terminal and the power supply terminal; a reference signal generator circuit generating a reference signal by changing a level of the control signal; and a clamp controlling circuit connected between the power supply terminal and the output terminal, and controlling an operation of the clamp circuit in accordance with the reference signal. According to the semiconductor integrated circuit of the invention, even if dump surge takes place under an off state of the output transistor, the clamp controlling circuit does not operate to inactivate the clamp circuit. In addition, during the turn-off period of the output transistor, the clamp controlling circuit exerts its function to let the clamp circuit operate and clamp the counter electromotive force. Thus, it is possible to prevent breakdown of the output MOS transistor due to the dump surge and counter electromotive force with accuracy. Further, the withstand voltage of the output MOS transistor can be reduced to minimize a chip area, costs, and an installation area.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments.

First Embodiment

Referring first to FIGS. 1 to 5, a power IC according to a first embodiment of the present invention (semiconductor integrated circuit) is described. A feature of the power IC according to this embodiment resides in the provision of a delay circuit for delaying a signal that is an input to a clamp controlling circuit.

Figure 1:
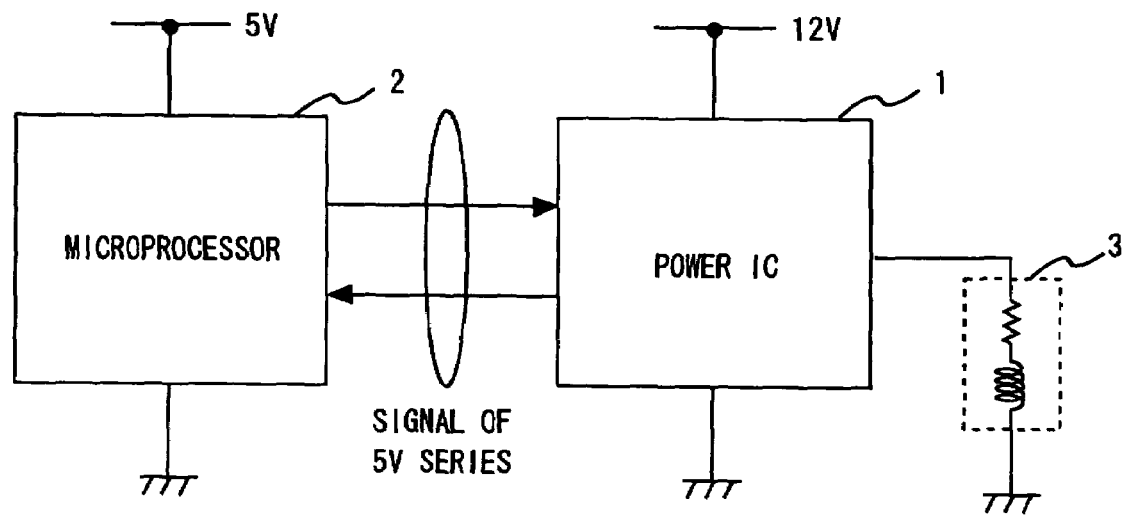
FIG. 1 shows the system configuration including a power IC according to an embodiment of the present invention.

FIG. 1 is referenced to describe the configuration of a system including the power IC according to the first embodiment of the present invention. This system controls an amount of current flowing through an inductive load 3. As shown in FIG. 1, the system includes a power IC 1, a microprocessor 2, and an inductive load 3. The power IC 1 and the microprocessor 2 are each one-chip semiconductor integrated circuits, for example. However, an arbitrary number of chips may be adopted.

The microprocessor 2 is connected with a power IC to exchange signals with the power IC 1. The microprocessor 2 sends a control signal for controlling current flowing through the inductive load 3 to the power IC 1 and receives a diagnosis signal indicating a status of the power IC 1 etc. from the power IC 1. The microprocessor 2 is a 5V powered microprocessor, and the signal exchanged with the power IC 1 is 5V.

The power IC 1 is connected with the microprocessor 2 and the inductive load 3. The power IC 1 controls current flowing through the inductive load 3 in response to the control signal from the microprocessor 2. The power IC 1 diagnoses the statuses of the power IC 1 and the inductive load 3 to output a diagnosis signal to the microprocessor 2. The power IC 1 is, for example, driven at 12V.

The inductive load 3 is connected with the power IC 1 at one end and grounded at the other end. The inductive load 3 is an actuator or the like, which is supplied with current from the power IC 1 to utilize the current for operating each part. Further, the inductive load 3 is an equivalent circuit composed of an inductance component and a resistance component as shown in FIG. 1.

This system can be applied to, for example, automobiles, household electrical products, or robots. It is particularly preferred to configure the system such that the counter electromotive force is generated during a turn-off period, and the overvoltage such as a dump surge is generated during other period than the turn-off period.

Figure 2:
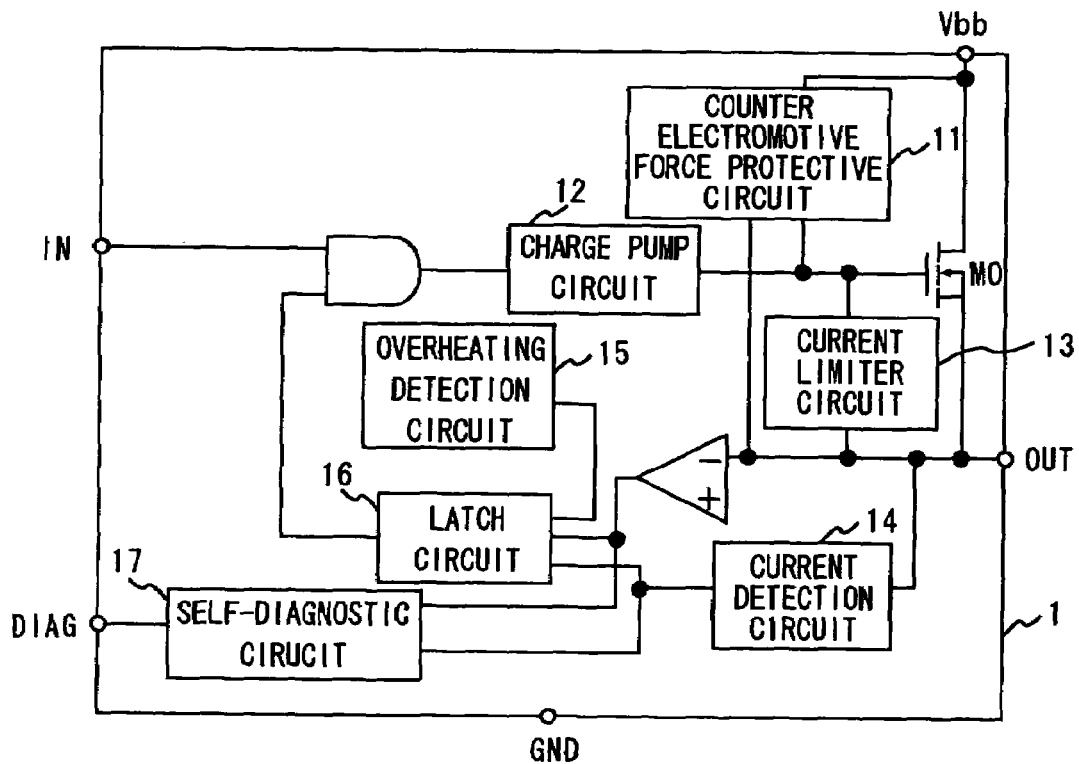
FIG. 2 is a block diagram showing the power IC according to the embodiment of the present invention.

Referring next to FIG. 2, the configuration of the power IC according to this embodiment is described. The power IC 1 is a high-side switch and includes, as shown in FIG. 2, an output MOS transistor M0, a counter electromotive force protective circuit 11, a charge pump circuit 12, a current limiter circuit 13, a current detection circuit 14, an overheating detection circuit 15, a latch circuit 16, and a self-diagnostic circuit 17. The circuit except for the output MOS transistor M0 is called a control circuit. The power IC 1 is not limited to the above but may have other configuration. In particular, portions except a circuit discussed below with reference to FIG. 3 may have any configuration.

The power IC receives a control signal through a terminal IN (input terminal) from the microprocessor 2 to send a diagnosis signal through a terminal DIAG (diagnostic terminal) to the microprocessor 2. A power supply voltage is applied to the power IC through the terminal Vbb (power supply terminal) from a battery etc. to supply current to the inductive load 3 through the terminal OUT (output terminal). In FIG. 2, a terminal GND (ground terminal) is provided but may be omitted because this embodiment aims at monitoring a potential difference between the gate and source of the output MOS transistor M0 for the circuit operation, not monitoring a potential difference from a GND potential, as described below.

The output MOS transistor M0 is a switch for controlling an amount of current flowing through the inductive load 3, which is capable of high-power operation. In general, MOS transistors are classified into two according to the configuration, that is, a horizontal element where current flows in parallel to the substrate surface, and a vertical element where current flows vertically to the substrate surface. The vertical element has one main electrode on the rear side of the semiconductor element, and thus is superior to the horizontal element in an ability to apply voltage per unit area. Thus, the vertical element is suitable for high-power application. For example, a vertical MOS transistor is used as the output MOS transistor M0.

The output MOS transistor M0 may be an N-channel or P-channel type. As for the high-side switch, the P-channel type is effective for simplifying the circuit configuration rather than the N-channel one, but the N-channel type only requires ½ of a chip size of the P-channel one insofar as the two have the same performance, so the N-channel type is preferred. If the N-channel MOS transistor is used as the high-side switch, a source follower configuration is obtained, that is, a source potential follows a gate potential.

In supplying current to the inductive load 3, a resistor component (on resistance) of the output MOS transistor M0 should be set appropriately in order to save the power consumption of the output MOS transistor M0. For utilizing the original on resistance of the MOS transistor, a gate-source potential difference needs to be set to a high enough value (e.g., 10 V). Therefore, the voltage boosted by the charge pump circuit 12 is applied to the gate.

The counter electromotive force protective circuit 11 protects the output MOS transistor M0 from the counter electromotive force generated during the turn-off period. The counter electromotive force protective circuit 11 includes a dynamic clamp circuit 31, a clamp controlling circuit 32, and a delay circuit 35 as mentioned above, and executes claiming during a turn-off period but does not execute clamping even if the dump surge occurs during an off period. The counter electromotive force protective circuit 11 protects the output MOS transistor M0 from the counter electromotive force based on a reference signal the rising or falling edge of which slopes more gently than the control signal supplied to the gate of the output MOS transistor M0.

The charge pump circuit 12 is a control signal generator circuit for generating the control signal to be supplied to the gate of the output MOS transistor M0. The charge pump circuit 12 is supplied with a power supply voltage to output a voltage higher than the applied voltage. The charge pump circuit 12 outputs the boosted voltage in response to a control signal from the microprocessor 2. As mentioned above, in order to utilize the original on resistance of the MOS transistor, if a battery voltage is, for example, 12 V, a voltage boosted by 10V (=22V) is applied to the gate of the output MOS transistor M0. The charge pump circuit 12 is composed of, for example, a capacitor, a diode, and an oscillator.

The current limiter circuit 13 functions to limit current flowing through the inductive load 3 that is short-circuited to GND. The current detection circuit 14 detects that a predetermined amount of current or more flows through the inductive load 3 to send the detection result to the self-diagnostic circuit 17. The overheating detection circuit 15 detects that the temperature of the power IC 1 reaches or exceeds a predetermined value to send the detection result to the self-diagnostic circuit 17 through the latch circuit 16. The latch circuit 16 latches signals supplied from the overheating detection circuit 15 or the like to send the latched signals to the self-diagnostic circuit 17. The self-diagnostic circuit 17 diagnoses the statuses of the inductive load 3 and power IC 1 on the basis of the signals from the current detection circuit 14, the overheating detection circuit 15, or the like to send the diagnosis signal to the microprocessor 2.

Figure 3:
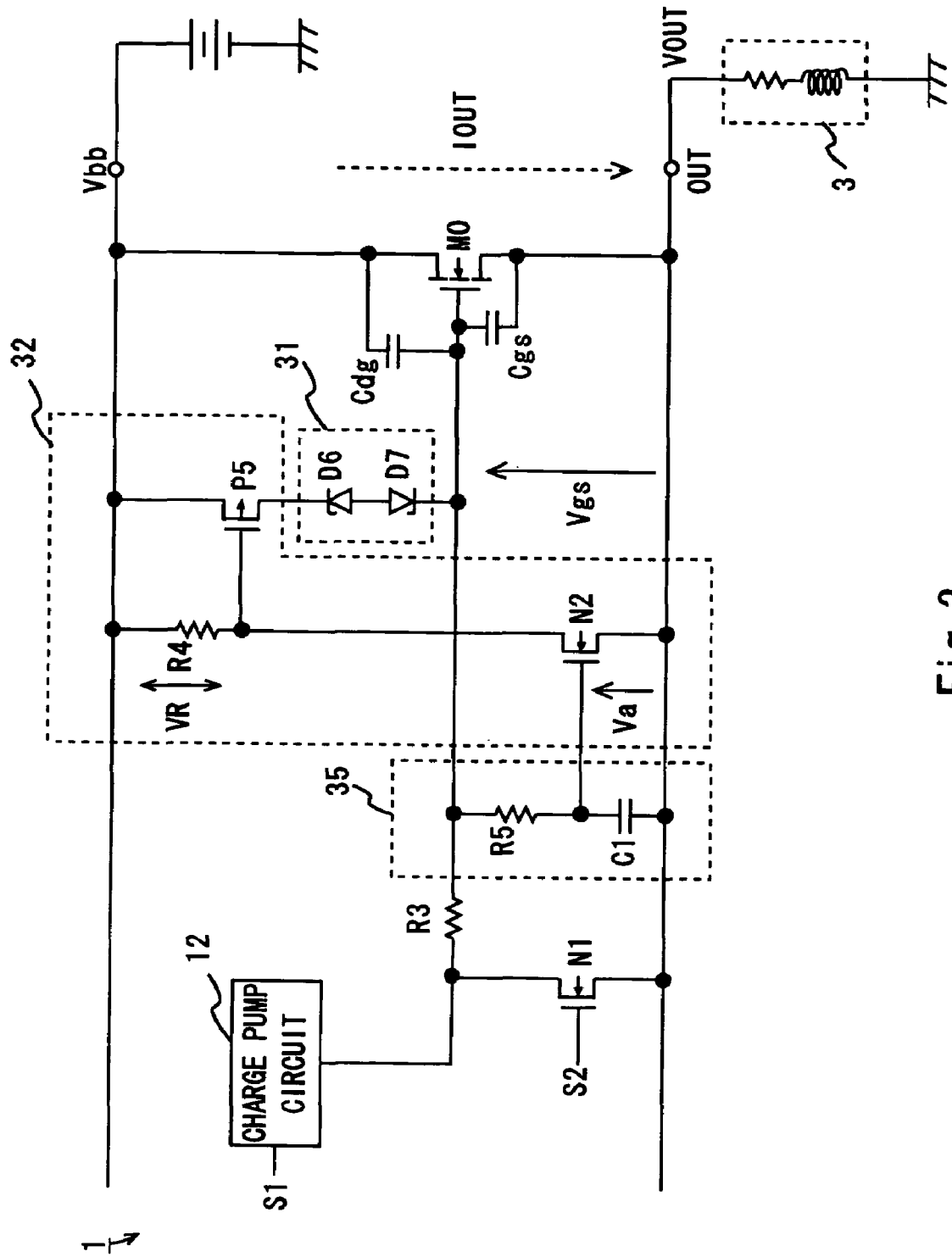
FIG. 3 is a circuit diagram showing the power IC according to the embodiment of the present invention.

Referring next to a circuit diagram of FIG. 3, the circuit configuration of the power IC according to this embodiment is described. FIG. 3 centers on a part of the power IC 1 of FIG. 2, which includes the output MOS transistor M0, the counter electromotive force protective circuit 11, and the charge pump circuit 12.

Figure 11:
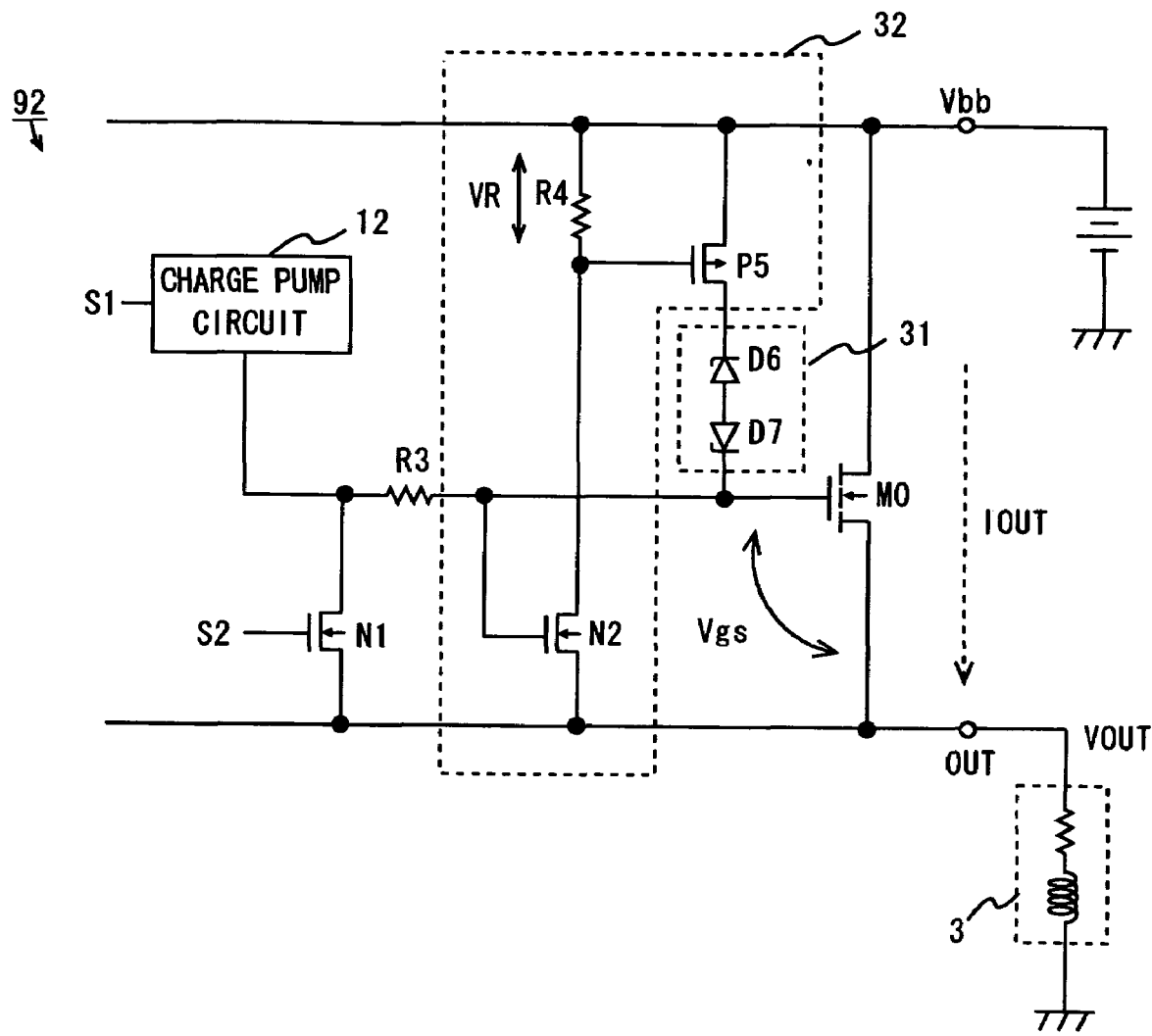
FIG. 11 is a circuit diagram of the conventional power IC.
Figure 12:
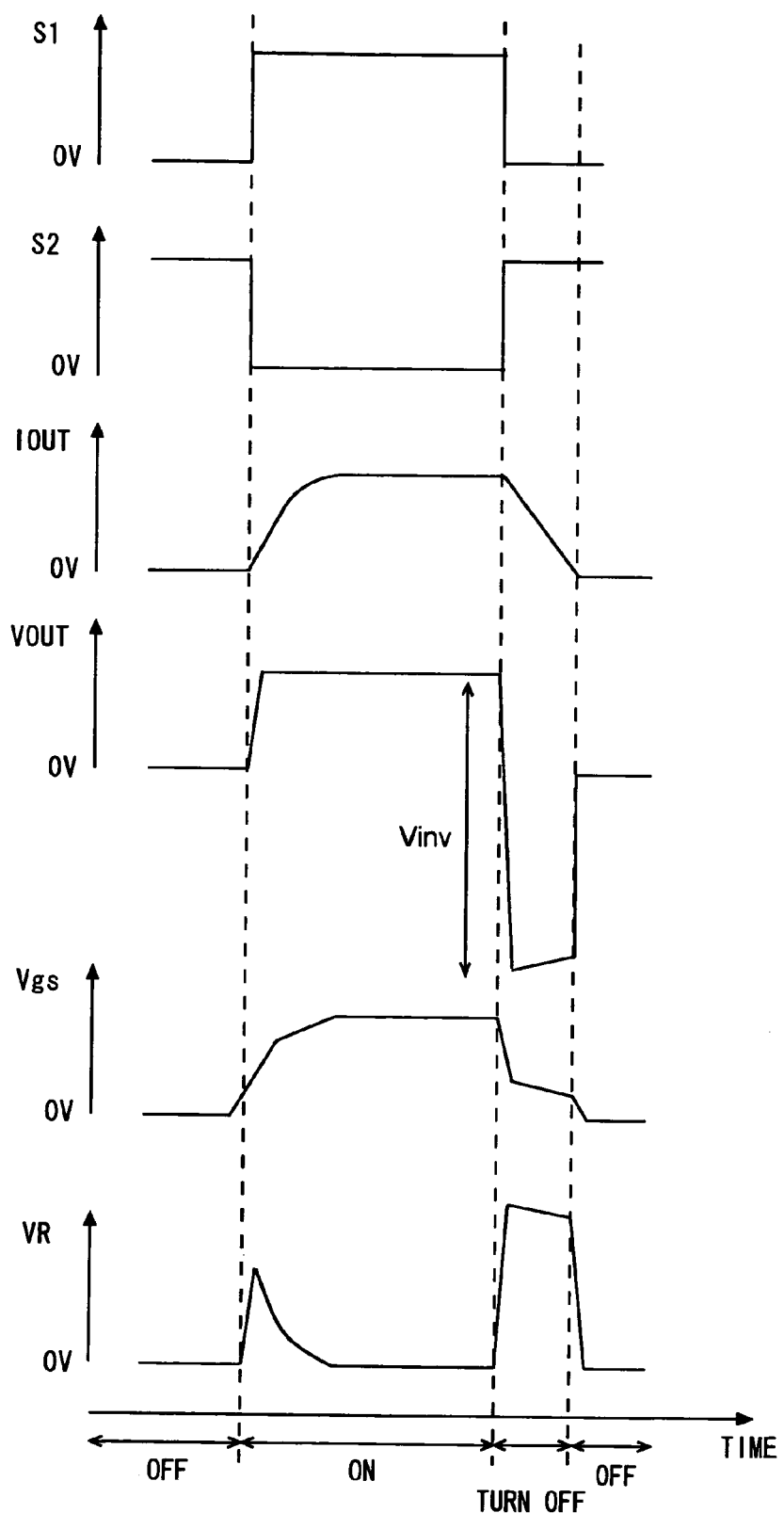
FIG. 12 is a timing chart of the conventional power IC.
Figure 13:
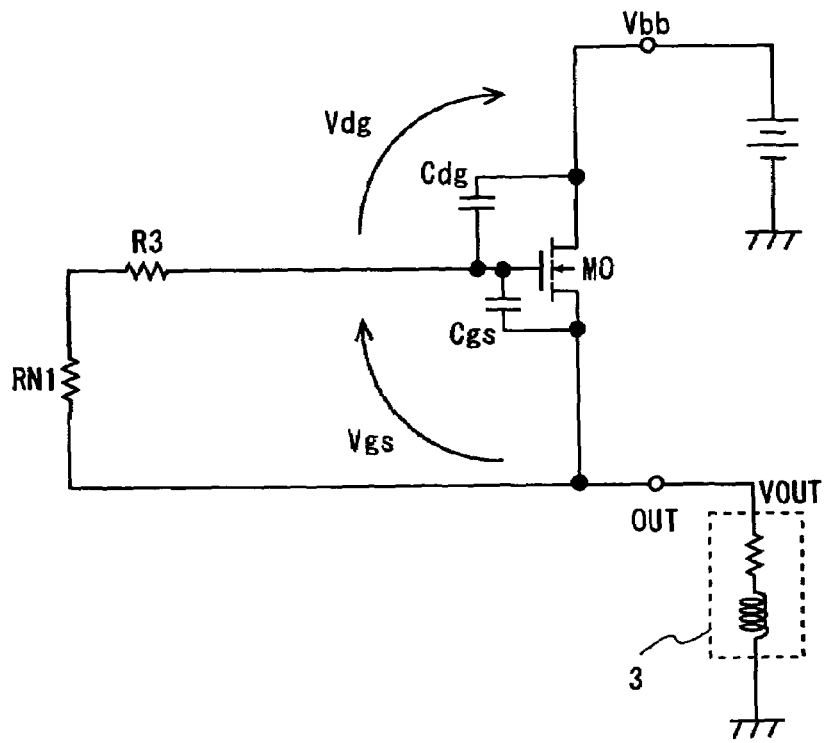
FIG. 13 is a circuit diagram of an equivalent circuit of the conventional power IC.
Figure 14:
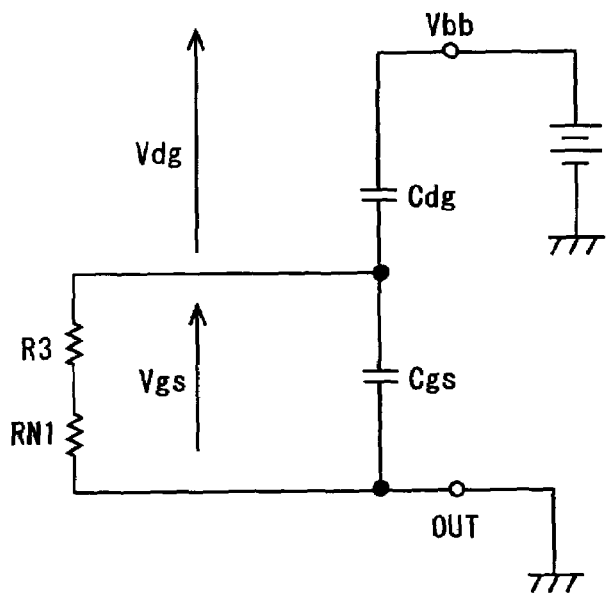
FIG. 14 is a circuit diagram of an equivalent circuit of the conventional power IC.
Figure 15:
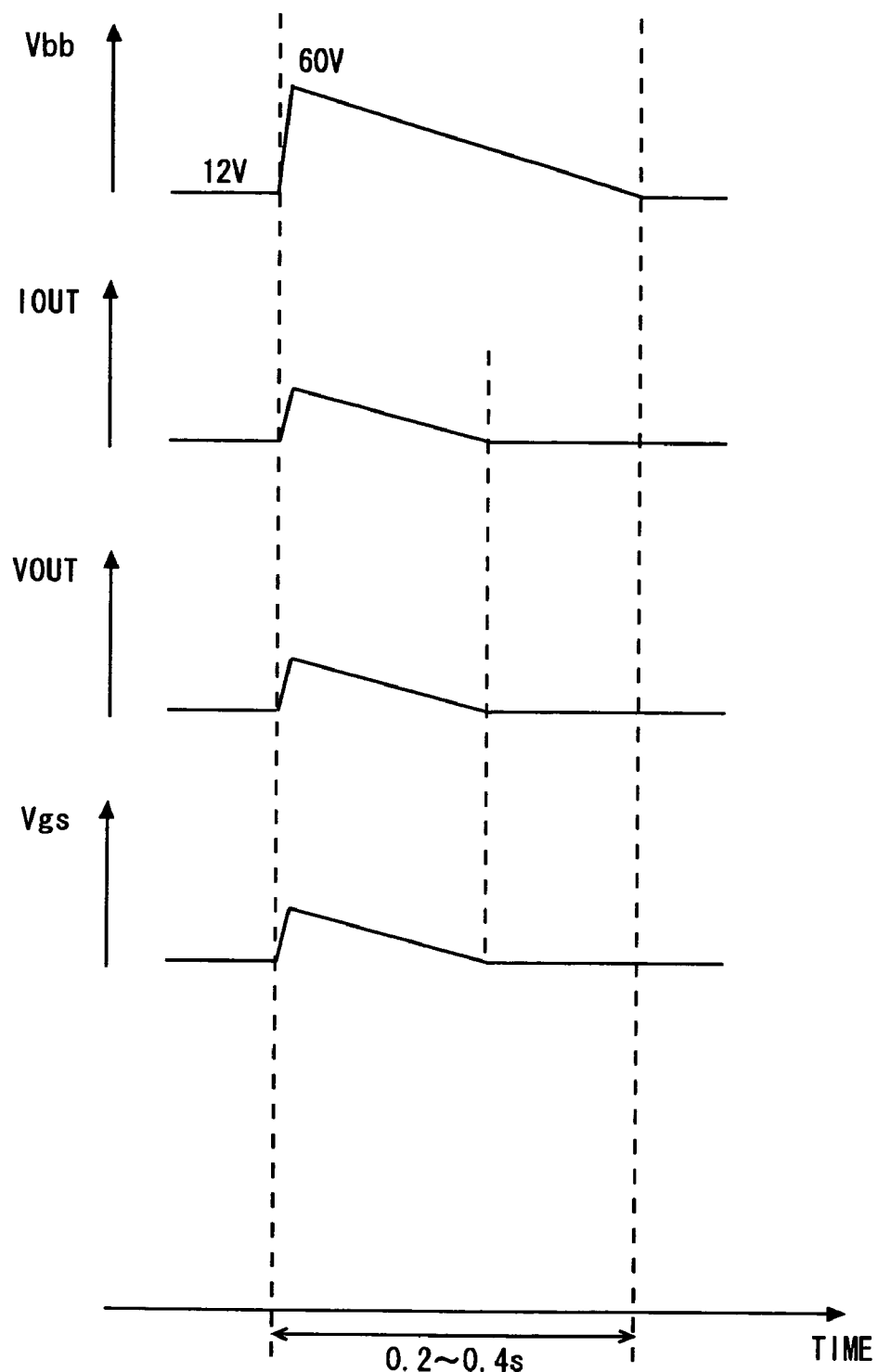
FIG. 15 is a timing chart of the conventional power IC.

The power IC 1 includes the delay circuit 35 in addition to the components of the conventional power IC 92 shown in FIG. 11. That is, the power IC 1 includes the output MOS transistor M0, the dynamic clamp circuit 31, the delay circuit 35, the clamp controlling circuit 32, the charge pump circuit 12, the resistor R3, and the gate discharge MOS transistor N1. Denoted by Cdg and Cgs are a drain-gate capacitance (parasitic capacitance) and a gate-source capacitance (parasitic capacitance) of the output MOS transistor M0, respectively. The counter electromotive force protective circuit 11 of FIG. 2 includes, for example, the dynamic clamp circuit 31, the clamp controlling circuit 32, and the delay circuit 35. The resistor R3 or gate discharge MOS transistor N1 is omitted from FIG. 2.

Hereinafter, the respective components of the power IC 1 are described in detail. The charge pump circuit 12 is connected with the gate of the output MOS transistor M0 through the resistor R3. The charge pump circuit 12 outputs/does not output the boosted voltage in accordance with the control signal S1 from the microprocessor 2.

The gate discharge MOS transistor N1 is a discharging circuit for releasing the charges of the gate of the output MOS transistor M0 to the terminal OUT when the output MOS transistor M0 is turned off. The gate discharge MOS transistor N1 has a drain connected with a node between the charge pump circuit 12 and the resistor R3, has a gate receiving a control signal S2, and has a source connected with the terminal OUT. The gate discharge MOS transistor N1 is turned on/off in response to the control signal S2 from the microprocessor 2. When the gate discharge MOS transistor N1 is turned on, the node between the charge pump circuit 12 and the resistor R3 is connected with the terminal OUT. For example, the gate discharge MOS transistor N1 is an N-channel, horizontal MOS transistor.

The delay circuit 35 is a kind of reference signal generator circuit for generating a reference signal by adjusting a level of the gate-source voltage Vgs (control signal). Also, this reference signal is a signal the rising or falling edge of which slopes more gently than the gate-source voltage Vgs. The delay circuit 35 gives a predetermined delay to the gate-source voltage Vgs (control signal) to generate a reference signal Va; its signal voltage level is adjusted during a predetermined period.

In the illustrated example, the delay circuit 35 is a CR integrating circuit including series-connected resistor R5 and capacitor C1. The resistor R5 has one end connected with a node between the resistor R3 and the gate of the output MOS transistor M0 and has the other end connected with one end of the capacitor C1. The other end of the capacitor C1 is connected with the terminal OUT. The reference signal Va is supplied through the node between the resistor R5 and the capacitor C1. When the gate-source voltage Vgs is applied across the delay circuit 35, the capacitor C1 is charged with current flowing through the resistor R5 to delay the voltage across the capacitor C1 by a period defined by time constants of the resistor R5 and capacitor C1 to obtain the reference signal Va.

The delay circuit 35 may have any other configuration as long as the reference signal Va can be generated. For example, the resistor R5 may be a constant current source made up of a depletion MOS or the like.

The clamp controlling circuit 32 includes a MOS transistor N2, a clamp switch MOS transistor P5, and a resistor R4. The clamp controlling circuit 32 controls the on/off (operation/non-operation) of the dynamic clamp circuit 31 in accordance with the reference signal Va.

The MOS transistor N2 (first clamp controlling transistor) has a drain connected with the terminal Vbb through the resistor R4 (clamp controlling resistor), has a source connected with the terminal OUT, and has a gate connected with a node between the resistor R5 and the capacitor C1. The gate of the MOS transistor N2 receives the reference signal Va. In response to the reference signal Va, the MOS transistor N2 is turned on/off. If the MOS transistor N2 is turned on, the resistor R4 is connected with the terminal OUT. For example, the MOS transistor N2 is an N-channel, horizontal MOS transistor.

The clamp switch MOS transistor P5 (second clamp controlling resistor) has a source connected with the terminal Vbb, has a gate connected with a node between the resistor R4 and a drain of the MOS transistor N2, and has a drain connected with the dynamic clamp circuit 31. The clamp switch MOS transistor P5 is turned on/off in response to the voltage VR (signal at a node between the resistor R4 and the MOS transistor N2) applied to the resistor R4. If the clamp switch MOS transistor P5 is turned on, the terminal Vbb is connected with the dynamic clamp circuit 31 to let the dynamic clamp circuit 31 operate. If the clamp switch MOS transistor P5 is turned off, the terminal Vbb is disconnected from the dynamic clamp circuit 31 to inactivate the dynamic clamp circuit 31. For example, the clamp switch MOS transistor P5 is a P-channel, horizontal MOS transistor.

The dynamic clamp circuit 31 includes a high-voltage diode D6 and a backflow preventive diode D7. The high-voltage diode D6 is a Zener diode, which functions to clamp the counter electromotive force generated during the turn-off period with a breakdown voltage. The backflow preventive diode D7 functions to prevent current backflow from the gate of the output MOS transistor M0 to the source due to the voltage boosted with the charge pump circuit 12, which is higher than the power supply voltage at the terminal Vbb.

Anodes of the high-voltage diode D6 and backflow preventive diode D7 are serried-connected. A cathode of the high-voltage diode D6 is connected with the drain of the clamp switch MOS transistor P5, and a cathode of the backflow preventive diode D7 is connected with the gate of the output MOS transistor M0. The dynamic clamp circuit 31 is not limited to this configuration, and an arbitrary number of diodes may be further connected in series.

As mentioned above, the output MOS transistor M0 has a drain connected with the terminal Vbb, has a gate connected with the charge pump circuit 12 through the resistor R3, and has a source connected with the terminal OUT.

Figure 4:
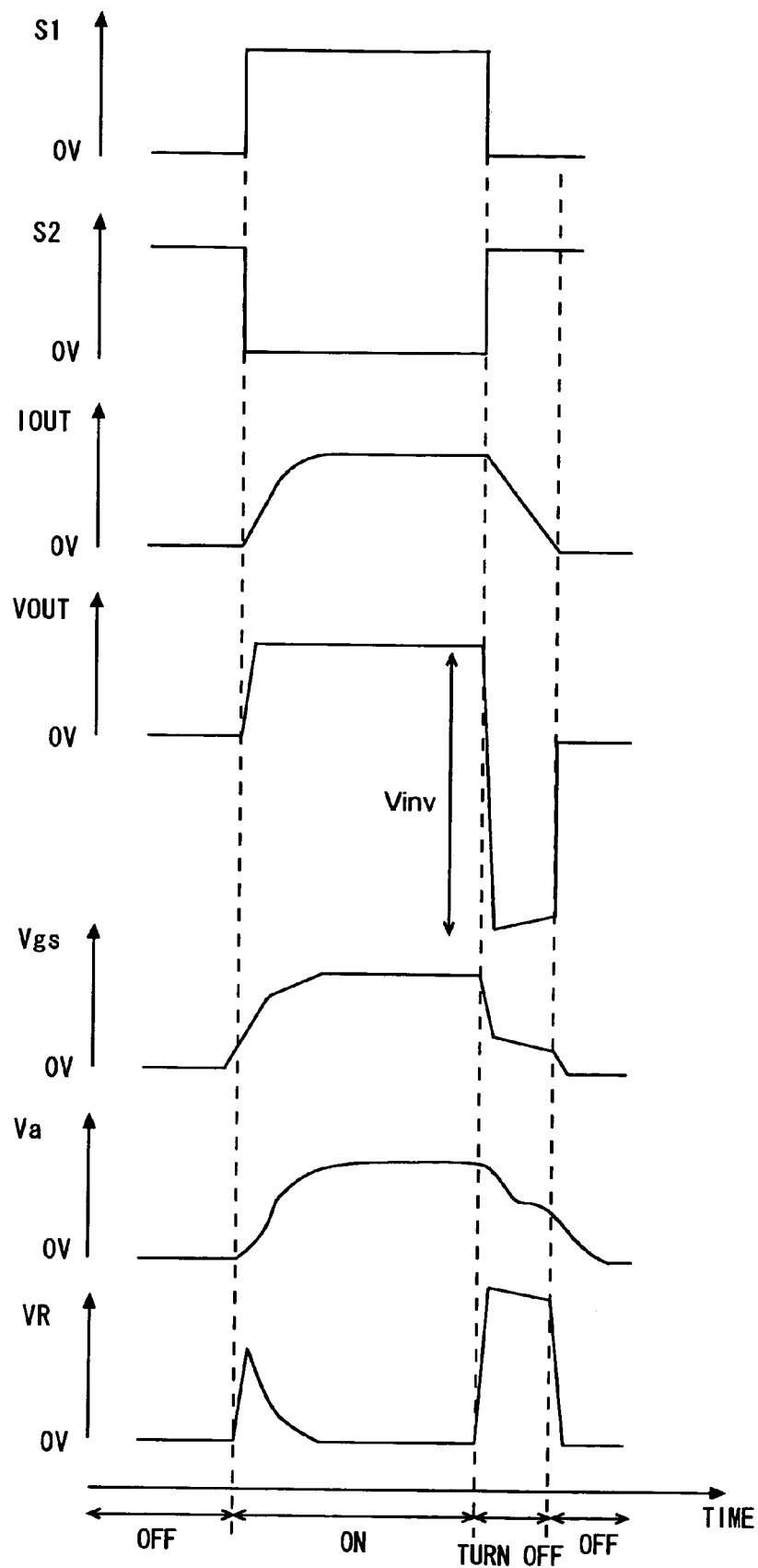
FIG. 4 is a timing chart of the power IC according to the embodiment of the present invention.

Referring next to a timing chart of FIG. 4, the operation of the power IC according to this embodiment is described. This timing chart shows timings of each signal when the output MOS transistor M0 is switched from off to on, and then from on to off. As shown in FIG. 4, the control signal S1 is at a low level during an off state of the transistor, and is at a high level during an on state. Further, the control signal S2 is at a high level during the off state, and is at a low level during an on state in contrast to the control signal S1.

As shown in FIG. 4, the reference signal Va has a waveform that is a rounded one of the gate-source voltage Vgs waveform. On the rising edge of the gate-source voltage Vgs, the gate-source voltage Vgs level is higher than the reference signal Va, while on the falling edge of the gate-source voltage Vgs, the gate-source voltage Vgs level is lower than the reference signal Va.

If the output MOS transistor M0 is turned on, the control signal S1 is set at a high level to thereby let the charge pump circuit 12 output the boosted voltage. Further, the control signal S2 is set at a low level to thereby turn off the gate discharge MOS transistor N1, and supply the boosted voltage from the charge pump circuit 12 to the gate of the output MOS transistor M0 through the resistor R3. As a result, the gate-source voltage Vgs of the output MOS transistor M0 increases to turn on the output MOS transistor M0. Hence, the output current IOUT flows through the inductive load 3 to apply the output voltage VOUT.

When the output MOS transistor M0 is turned off, the control signal S1 is set at a low level to make the charge pump circuit 12 stop outputting the boosted voltage. Further, the control signal S2 is set at a high level to turn on the gate discharge MOS transistor N1 and release the gate charges of the output MOS transistor M0 to the terminal OUT through the resistor R3 and the gate discharge MOS transistor N1. As a result, the gate-source voltage Vgs decreases to turn off the output MOS transistor M0. Hence, the supply of the output current IOUT and output voltage VOUT stops.

Here, the clamping operation for each state of the output MOS transistor M0 is described. During an off period of the output MOS transistor M0, Va=Vgs=0V, so the MOS transistor N2 is turned off. Further, no voltage VR is generated across the resistor R4 to turnoff the clamp switch MOS transistor P5. Hence, the dynamic clamp circuit 31 is inactivated, in other words, does not exert the clamping function.

During the turn-on period of the output MOS transistor M0, the gate-source voltage Vgs involves a potential difference, and the reference signal Va accordingly involves a potential difference. In response, the MOS transistor N2 is gradually turned on to increase the voltage VR across the resistor R4 and turn on the clamp switch MOS transistor P5. As a result, the dynamic clamp circuit 31 is activated, but in this case, the counter electromotive force is not generated with the inductive load 3, so the dynamic clamp circuit does not exert the claiming function.

When the output MOS transistor M0 is turned on, the MOS transistor N2 is turned on due to the reference signal Va. However, since the potential of the terminal Vbb is almost equal to that of the terminal OUT, the voltage VR≈0 V, and the clamp switch MOS transistor P5 is turned off. As a result, the clamping function is not exerted.

When the output MOS transistor M0 is turned off, the reference signal Va has a potential difference, so the MOS transistor N2 is kept on to increase the voltage VR and turn on the clamp switch MOS transistor P5 as well. As a result, the dynamic clamp circuit 31 is inactivated. At this time, the inductive load 3 generates the counter electromotive force Vinv, and the counter electromotive force Vinv is reduced to the breakdown voltage of the high-voltage diode D6, by which the high-voltage diode D6 is broken down, and avalanche current is supplied to the gate of the output MOS transistor M0. Accordingly, the counter electromotive force Vinv is clamped with the breakdown voltage of the high-voltage diode D6. As mentioned above, this embodiment has a feature that the dynamic clamp circuit 31 operates only during the turn-off period in which the counter electromotive force is generated.

Figure 5:
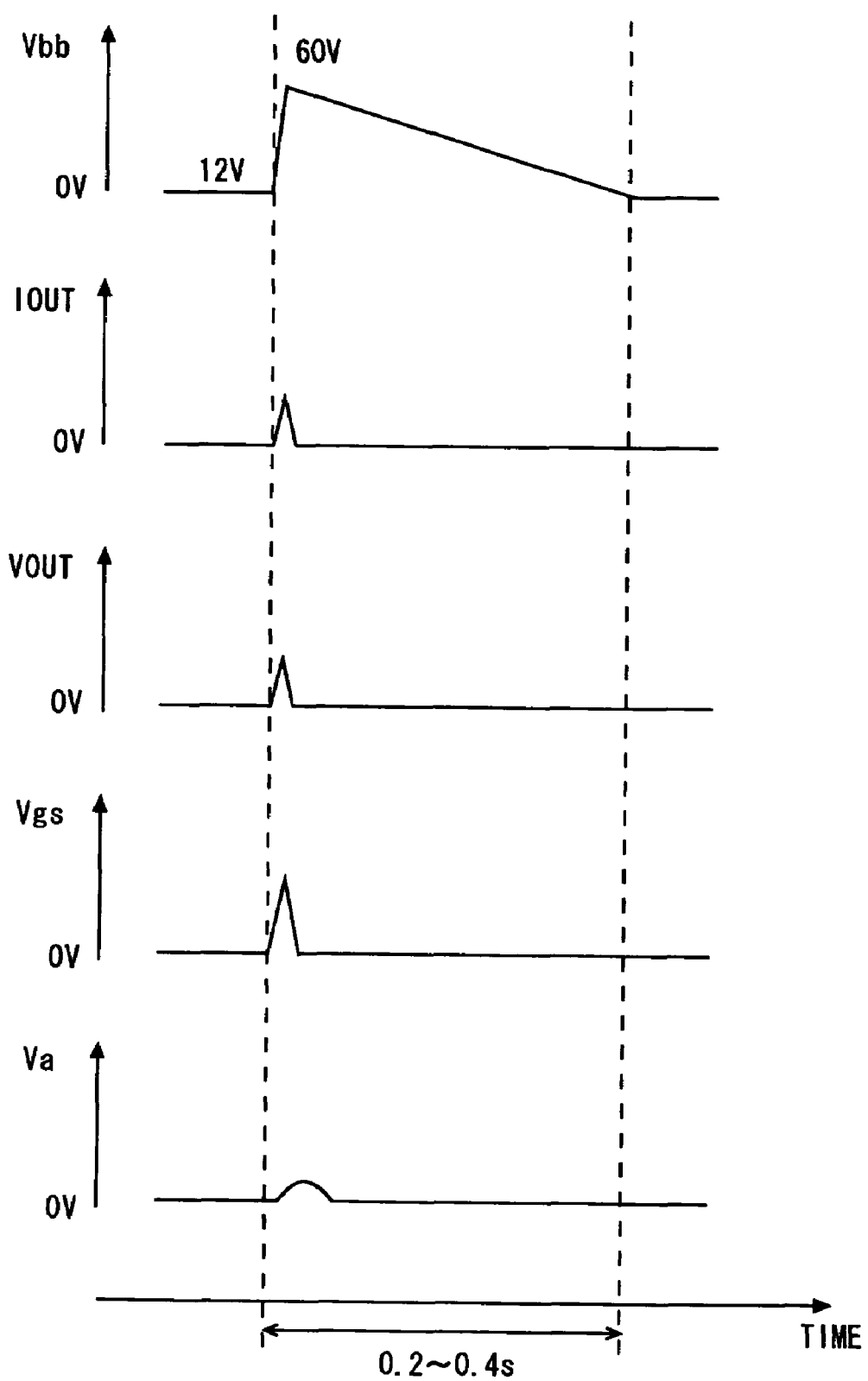
FIG. 5 is a timing chart of the power IC according to the embodiment of the present invention.

Referring next to a timing chart of FIG. 5, the operation of the power IC according to this embodiment upon the dump surge is described. This timing chart shows timings of each signal when the dump surge takes place under an off state of the output MOS transistor M0. The potential of the terminal Vbb is generally about, for example, 12V of the power supply voltage but would reach about 60V upon the dump surge and remain at the voltage level during 0.2 to 0.4 seconds. As mentioned above, in the case where the output MOS transistor M0 is turned off, just after the dump surge, the gate-source voltage Vgs increases to turn on the output MOS transistor M0.

As shown in FIG. 4, the gate-source voltage Vgs abruptly increase and then abruptly drops immediately, so the reference signal Va obtained by delaying the gate-source voltage Vgs (control signal) is kept at about 0 V with little increase. Accordingly, the MOS transistor N2 stays in an off state, and the dynamic clamp circuit 31 is kept in a non-operation state. Since the gate charges of the output MOS transistor M0 are released with the gate discharge MOS transistor N1, the gate-source voltage Vgs reduces to 0 V at once to turn off the output MOS transistor MO.

On the other hand, when the dump surge takes place under an on state of the output MOS transistor M0, the dynamic clamp circuit 31 does not operate to let the output MOS transistor M0 and the inductive load 3 consume the dump surge energy.

For example, if the dump surge of 60 V takes place on the assumption that the resistance of the inductive load 3 is set to 10 Ω, and the on resistance of the output MOS transistor M0 is set to 100 mΩ, a potential difference between the drain and source of the output MOS transistor M0 becomes 0.59 V (=60V×100 mΩ/10.1 Ω), and the reminder, 59.41 V is applied to the inductive load 3. As mentioned above, the resistance of the inductive load 3 is much higher than the on resistance of the output MOS transistor M0 (in this example, 100 times higher), so most of the energy is consumed by the inductive load 3 and thus the output MOS transistor M0 by no means breaks.

TABLE 1

| | Related Art | Embodiment of the Invention | Comparison |
|---|---|---|---|
| Withstand voltage of output MOS | 90 V (= 70 + 10 + 10) | 70 V (= 60 + 10) | −20 V |
| Breakdown voltage of diode | 70 V (= 60 + 10) | 50 V (= 70 − 10 − 10) | −20 V |
| Area of output MOS | 9 mm$^2$ | 7 mm$^2$ | −2 mm$^2$ |
| Area of control circuit | 1 mm$^2$ | 1.1 mm$^2$ (= 1 + 0.003 + 0.003 + 0.005 + 0.05 + 0.04) | +0.1 mm$^2$ |
| Chip area | 10 mm$^2$ | 8.1 mm$^2$ | −1.9 mm$^2$ (−19%) |

Figure 10:
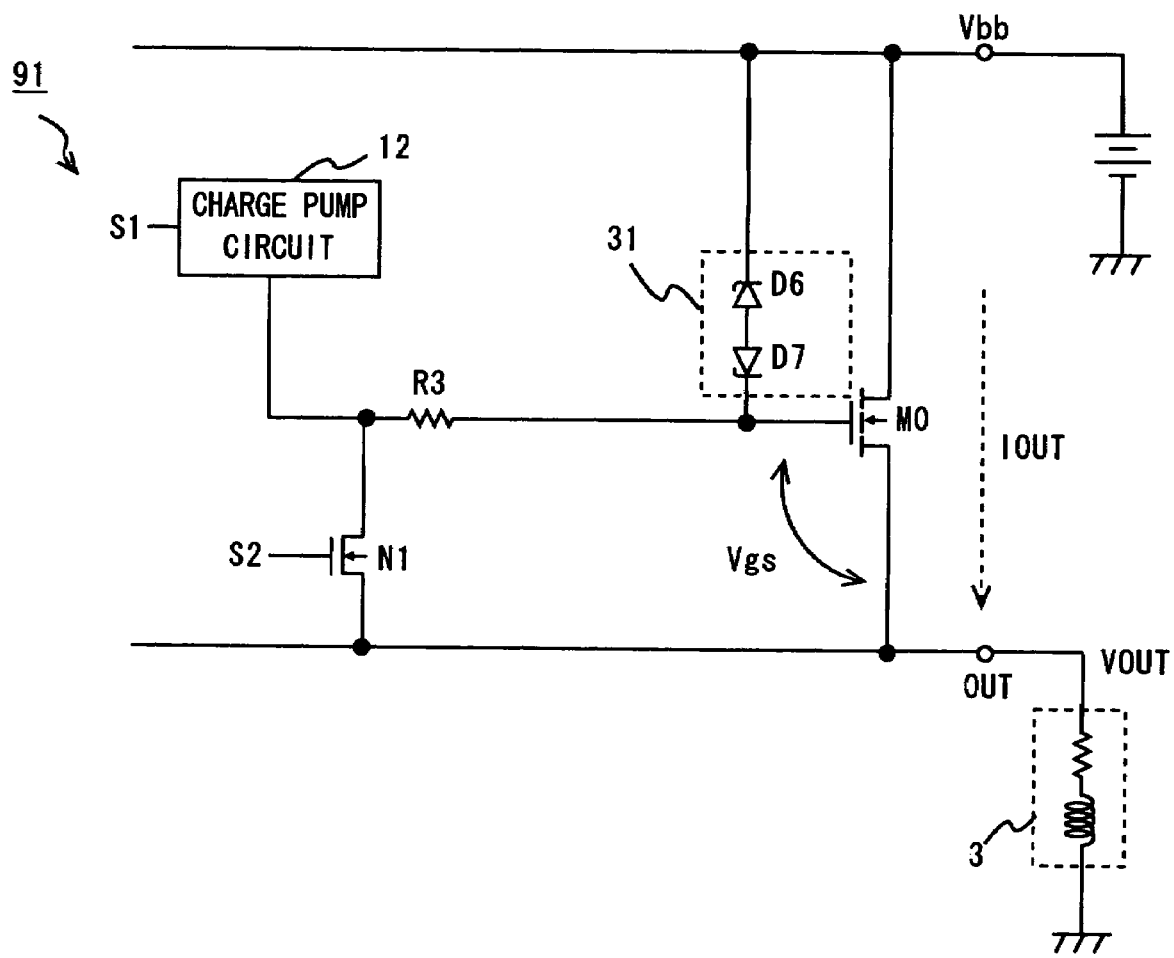
FIG. 10 is a circuit diagram of a conventional power IC.

Table 1 shows a calculation result of a chip area of a power IC of the related art and the power IC of this embodiment. In this example, the conventional power IC 91 of FIG. 10 is compared with the power IC 1 of FIG. 3. In the conventional power IC 91, the withstand voltage of the output MOS transistor M0 should be set higher than the breakdown voltage of the high-voltage diode D6, so the breakdown voltage of the high-voltage diode D6 is 70 V with a margin of 10 V with respect to the dump surge of 60 V. The withstand voltage of the output MOS transistor M0 of the conventional power IC 91 is 90 V in consideration of variations (±10 V) of the high-voltage diode and the variations (±10 V) of the withstand voltage of the output MOS transistor M10. Further, in this example, an element area of the output MOS transistor M0 in the conventional power IC 91 is set to 9 mm$^2$, an element area of the control circuit that is the circuit excluding the output MOS transistor M0 is set to 1 mm$^2$, and a chip area of the conventional power IC 91 is set to 10 mm$^2$.

In the power IC 1 of this embodiment, it is only necessary to consider the withstand voltage of the output MOS transistor M0 without taking into account the withstand voltage of the high-voltage diode D6 at the time of dump surge, so the withstand voltage of the output MOS transistor M0 is 70 V with a margin of 10 V with respect to the dump surge of 60 V, which value is 20 V lower than the related art. The breakdown voltage of the high-voltage diode D6 in the power IC 1 is set to 50 V in consideration of variations (±10 V) of the high-voltage diode D6 and the variations (±10 V) of the withstand voltage of the output MOS transistor M0. Further, in the power IC 1, an element area of the output MOS transistor M0 in the conventional power IC 91 is set to 7 mm$^2$, which value is 2 mm$^2$ smaller than the related art because the withstand voltage of the output MOS transistor M0 is 20 V lower than the related art. An element area of the control circuit in the power IC 1 is set to 1.1 mm$^2$; the resistor R4 accounts for 0.003 mm$^2$, the MOS transistor N2 accounts for 0.003 mm$^2$, the clamp switch MOS transistor P5 accounts for 0.005 mm$^2$, the resistor R5 accounts for 0.04 mm$^2$, and the capacitor C1 accounts for 0.05 mm$^2$, due to the additional provision of the elements of the clamp controlling circuit 32 and the delay circuit 35. This value is 0.1 mm$^2$ larger than the related art. Thus, a chip area of the power IC 1 is set to 8.1 mm$^2$, which value is 1.9 mm$^2$ smaller than the related art to reduce a chip size by 19%.

With the above configuration, in the case where the level of the reference signal obtained by delaying the gate-source voltage of the output MOS transistor M0 to round the edge of the signal is changed to a predetermined level, the dynamic clamp circuit 31 is made to operate. Hence, only when the counter electromotive force is generated as in the turn-off period, the dynamic clamp circuit 31 operates to prevent the output MOS transistor M0 from breaking.

Further, the clamping operation is controlled based on the reference signal obtained by delaying the gate-source voltage of the output MOS transistor M0, so even if the dump surge takes place during an on period, the dynamic clamp circuit 31 never operates. Further, even when the dump surge takes place during an on period, the dynamic clamp circuit 31 does not operate, and the output MOS transistor M0 and the inductive load 3 consume the energy of the dump surge. Therefore, the withstand voltage of the output MOS transistor M0 can be set without considering the withstand voltage of the high-voltage diode D6 of the dynamic clamp circuit 31, so the withstand voltage of the output MOS transistor M0 can be set at a lower value. As a result, it is possible to prevent the output MOS transistor M0 from breaking due to the counter electromotive force and a dump surge with accuracy, and to minimize the circuit area of the output MOS transistor M0, the power IC chip area, costs, and an installation area.

Second Embodiment

Referring next to FIGS. 6 to 9, a power IC (semiconductor integrated circuit) according to a second embodiment of the present invention is described. A feature of the power IC according to this embodiment resides in the provision of a hysteresis circuit for adjusting a level of a signal that the clamp controlling circuit references.

Figure 6:
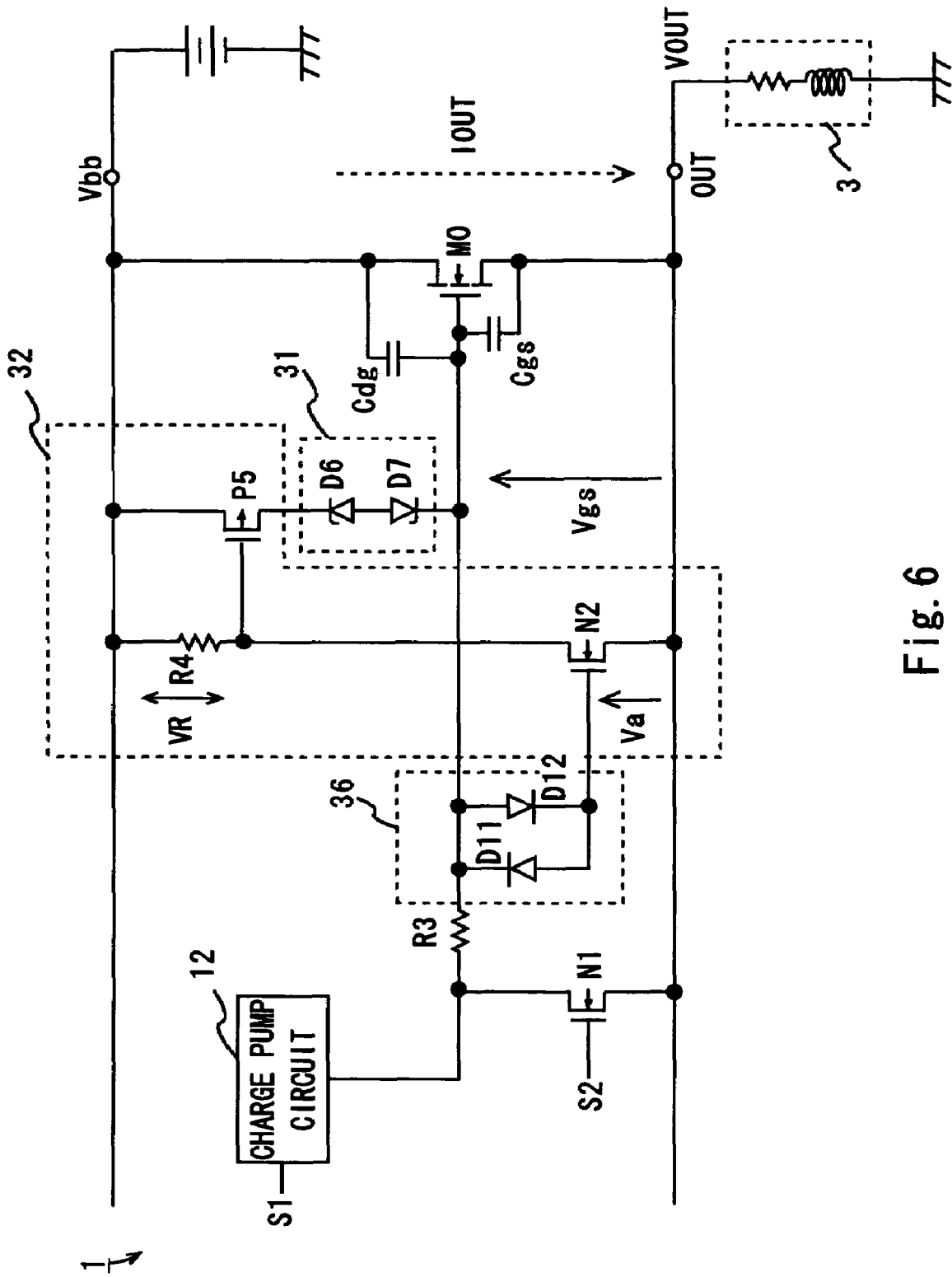
FIG. 6 is a circuit diagram showing a power IC according to another embodiment of the present invention.

Referring now to a circuit diagram of FIG. 6, the circuit configuration of the power IC according to this embodiment is described. Similar to FIG. 3, FIG. 6 centers on a part of the output MOS transistor M0 of the power IC 1 of FIG. 2, inclusive of the counter electromotive force protective circuit 11 and the charge pump circuit 12. In FIG. 6, the same components as those of FIG. 3 are denoted by like reference numerals, and their detailed description is omitted if not necessary.

In the power IC 1, the delay circuit 35 of FIG. 3 is replaced by a hysteresis circuit 36. The hysteresis circuit 36 is a kind of the reference signal generator circuit for generating the reference signal Va like the delay circuit 35. The hysteresis circuit 36 changes a voltage level on the rising edge and falling edge of the gate-source voltage Vgs and rounds the edges of the signal. The hysteresis circuit 36 includes, in the illustrated example, diodes D11 and D12 connected in parallel and backward. A cathode of the diode D11 and an anode of the diode D12 are connected with a node between the resistor R3 and the gate of the output MOS transistor M0, and an anode of the diode D11 and a cathode of the diode D12 are connected with a gate (reference signal input terminal) of the MOS transistor N2. The diode D11 increases a voltage level of the gate-source voltage Vgs on the falling edge by a predetermined level, and the diode D12 decreases the voltage level of the gate-source voltage Vgs upon the rising edge by a predetermined level.

If the potential of the gate-source voltage Vgs is far beyond the threshold of the diode D12, current flows through the gate of the MOS transistor N2 from the gate of the output MOS transistor M0 through the diode D12. If the gate-source voltage Vgs is far below the threshold of the diode D11, current flows through the gate of the output MOS transistor M0 from the gate of the MOS transistor N2 through the diode D11.

Figure 7:
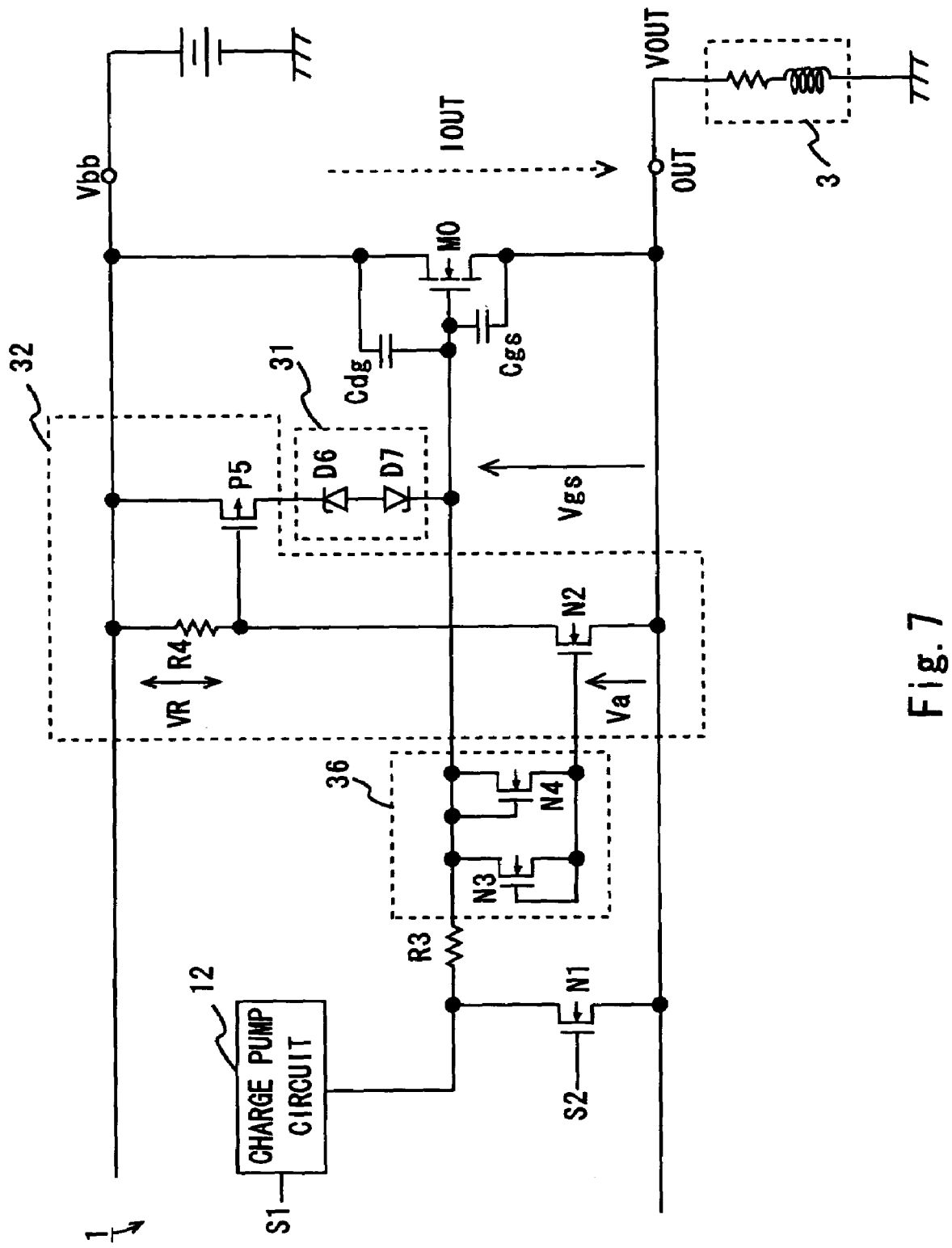
FIG. 7 is a circuit diagram showing the power IC according to the embodiment of the present invention.

Further, the hysteresis circuit 36 may include, as shown in FIG. 7, diode-connected MOS transistor N3 and MOS transistor N4. The circuit made up of the MOS transistor can reduce a circuit area rather than the circuit of diodes.

The MOS transistor N3 increases, similar to the diode D11, a level of the gate-source voltage Vgs on the falling edge by a predetermined level, and the MOS transistor N4 decreases a level of the gate-source voltage Vgs on the rising edge by a predetermined level similar to the diode D12.

The MOS transistor N3 has a gate and first terminal connected with a gate of the MOS transistor N2, and has a second terminal connected with the gate of the output MOS transistor M0. In general, a terminal applied with a higher voltage when current flows during an on period of the MOS transistor is called a drain, and a terminal applied with a lower voltage is called a source. In the MOS transistor N3, if the potential of the gate-source voltage Vgs is far below the threshold of the MOS transistor N3, current flows from the gate of the MOS transistor N2 toward the gate of the output MOS transistor M0, so the first terminal is a drain, and the second terminal is a source.

The MOS transistor N4 has a gate and first terminal connected with the gate of the output MOS transistor M0, and has a second terminal connected with the gate of the MOS transistor N2. In the MOS transistor N4, if the potential of the gate-source voltage Vgs is far beyond the threshold of the MOS transistor N4, current flows from the gate of the output MOS transistor to the gate to the MOS transistor N2, so the first terminal is a drain and a second terminal is a source.

Figure 8:
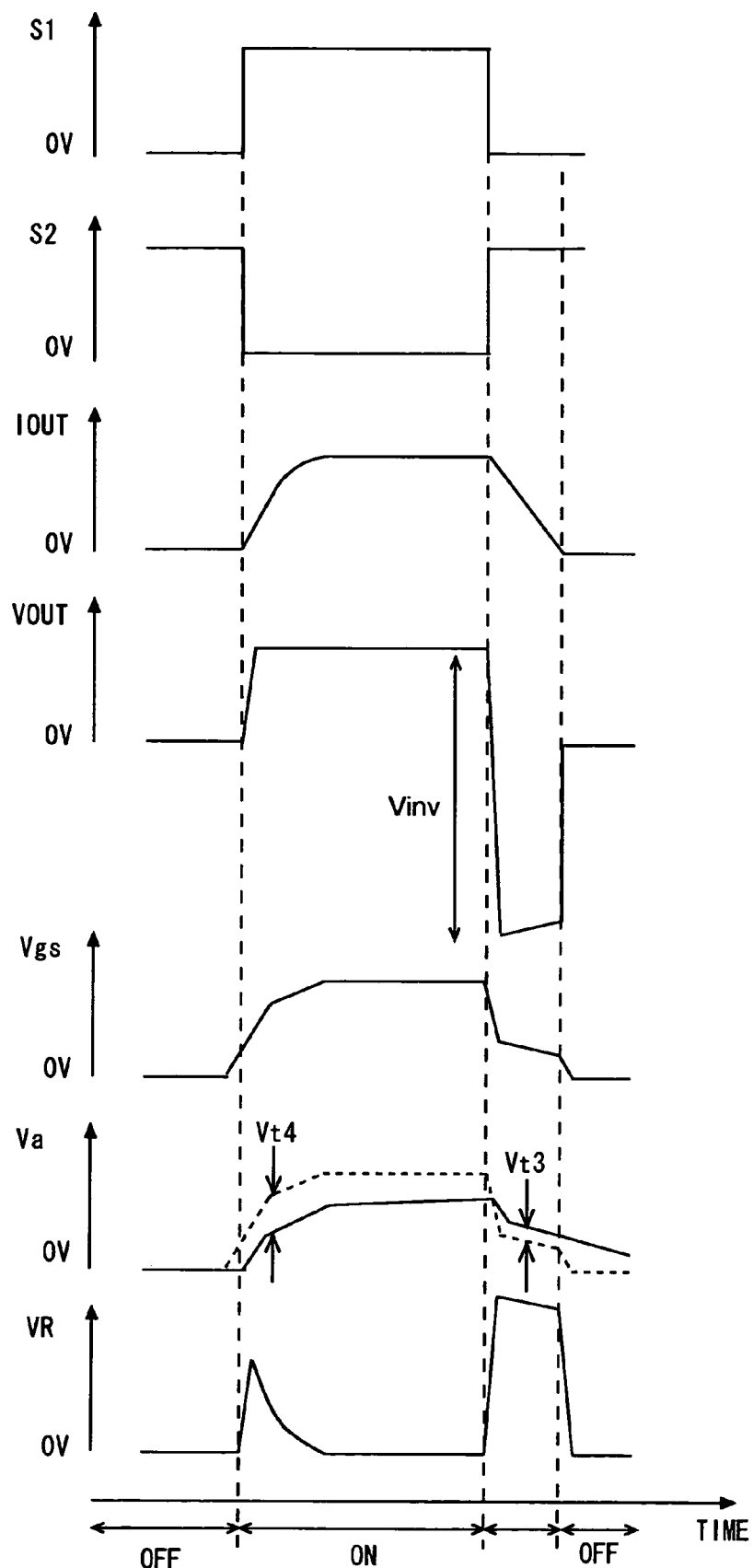
FIG. 8 is a timing chart showing the power IC according to the embodiment of the present invention.

FIG. 8 shows how the power IC according to this embodiment operates. Similar to FIG. 4, FIG. 8 is a timing chart showing timings of each signal when the output MOS transistor M0 is switched from off to on and then from on to off.

Provided that threshold values of the MOS transistor N2, the MOS transistor N3, and the MOS transistor N4 are represented by Vt2, Vt3, and Vt4, respectively, as shown in FIG. 8, the reference signal Va equals (Vgs−Vt4) along with an increase of the gate-source voltage Vgs. Meanwhile, along with the decrease of the gate-source voltage Vgs, the reference signal Va equals (Vgs+Vt3).

During the turn-off period of the output MOS transistor M0, as in FIG. 4, the MOS transistor N2 is turned on to activate the dynamic clamp circuit 31. During a period other than the turn-off period, as in FIG. 4, the dynamic clamp circuit 31 does not operate.

Figure 9:
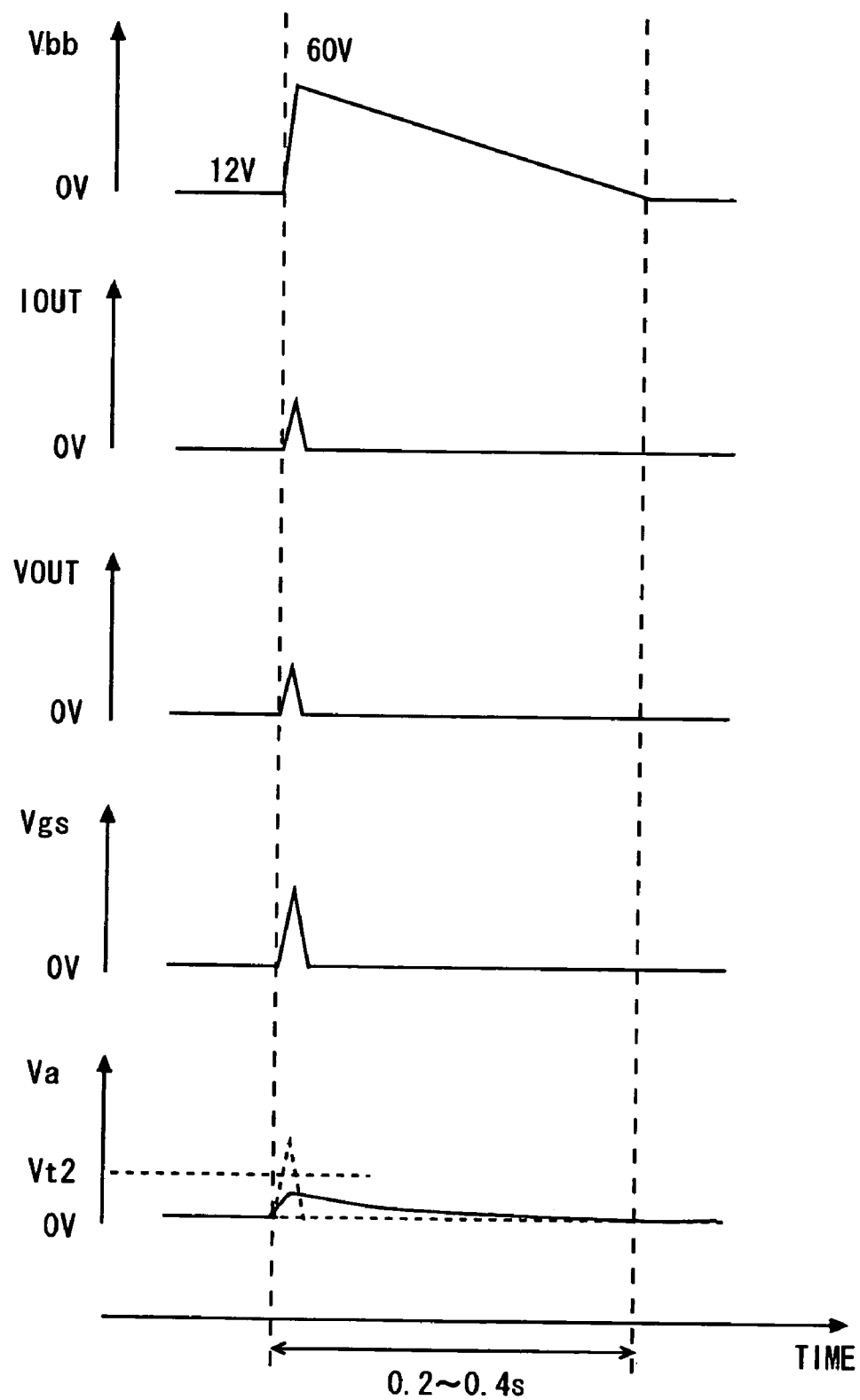
FIG. 9 is a timing chart of the power IC according to the embodiment of the present invention.

FIG. 9 shows the operation of the power IC according to this embodiment. Similar to FIG. 5, FIG. 9 is a timing chart of when the dump surge takes place during an off period of the output MOS transistor M0.

Even when the dump surge takes place during an off state of the output MOS transistor M0, Va=Vgs−Vt4. Accordingly, if the values of Vt2 and Vt4 are set to meet Vt2>Va at the time of dump surge, similar to FIG. 5, the MOS transistor N2 is kept in an off state, and the dynamic clamp circuit 31 does not operate.

As mentioned above, even if the delay circuit of the first embodiment is replaced by the hysteresis circuit, as in the first embodiment, the dynamic clamp circuit 31 does not operate even when the dump surge occurs during an off state, making it possible to protect the output MOS transistor from the counter electromotive force and the dump surge, and minimize a circuit area.

Other Embodiments

The delay circuit 35 or hysteresis circuit 36 may be replaced by a circuit for detecting the change of the gate-source voltage Vgs especially during the dump surge period such as an edge detecting circuit to inactivate the dynamic clamp circuit 31 under control at the time of dump surge. Further, the delay circuit 35 or hysteresis circuit 36 may be replaced by a circuit for detecting a change of the gate-source voltage Vgs especially during the turn-off period to activate the dynamic clamp circuit 31 during the turn-off period.

The above embodiments describe the power IC made up of the MOS transistors, but the MOS transistors may be replaced by other type ones. For example, a polarity (N channel or P channel) of each MOS transistor is changed or a bipolar transistor may be used instead of the MOS transistor.

In the above example, the dynamic clamp circuit, the clamp controlling circuit, the delay circuit, and the hysteresis circuit have the simple circuit configuration but may adopt other circuit configurations that realize similar functions. For example, the delay circuit may be a digital circuit such as a timer, or the hysteresis circuit may be a digital circuit such as a latch circuit. The clamp controlling circuit may be configured as disclosed in Japanese Unexamined Patent Publication No. 2005-223399.

It is apparent that the present invention is not limited to the above embodiment that may be modified and changed without departing from the scope and spirit of the invention.

What is claimed is:

1. A semiconductor integrated circuit connected between a power supply and an inductive load, comprising:
   an output transistor controlling current flowing through the inductive load;
   a clamp circuit clamping an overvoltage applied to the output transistor;
   a reference signal generator circuit generating a reference signal by adjusting a level of a control signal input to a control electrode of the output transistor, said reference signal generator circuit comprising one of a time delay function and a hysteresis function; and
   a clamp controlling circuit bringing the clamp circuit into operation based on the reference signal on condition that a counter electromotive force of the inductive load is applied to the output transistor.

2. The semiconductor integrated circuit according to claim 1, wherein the clamp controlling circuit inactivates the clamp circuit on condition that a dump surge of the power supply is applied to the output transistor.

3. The semiconductor integrated circuit according to claim 1, wherein the reference signal generator circuit gives a delay to the control signal to adjust a level of the control signal at a predetermined timing.

4. The semiconductor integrated circuit according to claim 3, wherein the reference signal generator circuit comprises a CR integrating circuit including a resistor element and a capacitor element.

5. The semiconductor integrated circuit according to claim 1, wherein the reference signal generator circuit decreases the control signal by a first level on a rising edge of the control signal, and increases the control signal by a second level on a falling edge of the control signal.

6. The semiconductor integrated circuit according to claim 5, wherein the reference signal generator circuit includes a first diode element decreasing the control signal by the first level and a second diode element increasing the control signal by the second level.

7. The semiconductor integrated circuit according to claim 5, wherein the reference signal generator circuit includes a first transistor decreasing the control signal by the first level and a second transistor increasing the control signal by the second level.

8. A semiconductor integrated circuit, comprising:
   a high-side switching circuit driving an inductive load;
   a control signal generator circuit generating a control signal controlling a driving operation of the high-side switching circuit, said control signal generator circuit comprising one of a time delay function and a hysteresis function;
   a discharging circuit discharging the control signal to the inductive load under an off-state of the high-side switching circuit; and
   a counter electromotive force protective circuit protecting the high-side switching circuit from a counter electromotive force based on a reference signal obtained by decreasing slope of a rising edge or a falling edge of the control signal.

9. A semiconductor integrated circuit, comprising:
   an output transistor connected between a power supply terminal supplied with power and an output terminal connected with an inductive load and operating in response to a control signal applied to a control terminal thereof;
   a clamp circuit connected between the control terminal and the power supply terminal;
   a reference signal generator circuit generating a reference signal by changing a level of the control signal, said reference signal generator circuit comprising one of a time delay function and a hysteresis function; and
   a clamp controlling circuit connected between the power supply terminal and the output terminal, and controlling an operation of the clamp circuit in accordance with the reference signal.

10. The semiconductor integrated circuit according to claim 9, wherein the clamp circuit includes:
    a high-voltage diode clamping a counter electromotive force applied to the output transistor; and
    a backflow preventive diode preventing a current backflow from the control terminal to the power supply terminal.

11. The semiconductor integrated circuit according to claim 9, wherein the clamp controlling circuit includes:
    a first clamp controlling transistor connected between the power supply terminal and the output terminal, and operating in response to the reference signal;
    a clamp controlling resistor series-connected with the first clamp controlling transistor; and
    a second clamp controlling transistor series-connected with the clamp circuit, and operating in response to a signal at a node between the clamp controlling resistor and the first clamp controlling transistor.

12. The semiconductor integrated circuit according to claim 9, wherein the reference signal generator circuit includes a resistor element and a capacitor element which are series-connected between the control terminal and the output terminal, and the reference signal is a signal at a node between the resistor element and the capacitor element.

13. The semiconductor integrated circuit according to claim 9, wherein the reference signal generator circuit includes a first diode element and a second diode element connected in parallel and in reverse direction between the control terminal and a reference signal input terminal of the clamp controlling circuit.

14. The semiconductor integrated circuit according to claim 9, wherein the reference signal generator circuit includes a first reference signal generating transistor and a second reference signal generating transistor which are parallel-connected between the control terminal and a reference signal input terminal of the clamp controlling circuit, the first reference signal generating transistor has a control terminal connected with the reference signal input terminal, and the second reference signal generating transistor has a control terminal connected with the control terminal of the output transistor.

15. The semiconductor integrated circuit according to claim 9, wherein the output transistor comprises a vertical type MOS transistor.

* * * * *